United States Patent

Wanat

Patent Number: 5,212,041
Date of Patent: May 18, 1993

[54] WATER DEVELOPABLE, NEGATIVE WORKING OVERLAY COLOR PROOFING SYSTEM UTILIZING WATER SOLUBLE POLYMERIC DIAZONIUM COMPOUND AND WATER INSOLUBLE, WATER SWELLABLE, BINDER RESIN

[75] Inventor: Stanley F. Wanat, Scotch Plains, N.J.

[73] Assignee: Hoechst Celanese Corporation, Somerville, N.J.

[21] Appl. No.: 679,361

[22] Filed: Apr. 2, 1991

Related U.S. Application Data

[60] Continuation-in-part of Ser. No. 431,257, Feb. 12, 1990, abandoned, which is a division of Ser. No. 183,841, Apr. 10, 1988, Pat. No. 4,914,039.

[51] Int. Cl.$^5$ .................. G03F 7/32; G03F 7/021; G03F 3/00
[52] U.S. Cl. .................. 430/143; 430/163; 430/175; 430/176; 430/271; 430/293; 430/325; 430/331
[58] Field of Search .............. 430/143, 163, 175, 176, 430/271, 293, 325, 331

[56] References Cited

U.S. PATENT DOCUMENTS

| | | | |
|---|---|---|---|
| 3,849,392 | 11/1974 | Steppan | 430/175 |
| 4,144,067 | 3/1979 | Ruckert et al. | 430/175 |
| 4,288,520 | 9/1981 | Sprintschnik | 430/169 |
| 4,436,804 | 3/1984 | Walls | 430/157 |
| 4,650,738 | 3/1987 | Platzer et al. | 430/143 |
| 4,748,101 | 5/1988 | Barton | 430/143 |

FOREIGN PATENT DOCUMENTS 1313777  4/1973  United Kingdom ............... 430/143

*Primary Examiner*—Charles L. Bowers, Jr.
*Assistant Examiner*—Christopher G. Young
*Attorney, Agent, or Firm*—Richard S. Roberts

[57] ABSTRACT

This invention relates to water developable, negative working photosensitized sheet constructions which, upon exposure to an actinic radiation source through a screened image, can accurately reproduce said image. The construction is useful as a color proofing film which can be employed to predict the image quality from a lithographic printing process. The invention provides both overlay and transfer type proofing sheets which have good fingerprint resistance.

9 Claims, 2 Drawing Sheets

TRANSFER MODE

⇩ LAMINATION

1) EXPOSURE
2) WATER

⇩

WATER DEVELOPABLE, NEGATIVE WORKING OVERLAY COLOR PROOFING SYSTEM UTILIZING WATER SOLUBLE POLYMERIC DIAZONIUM COMPOUND AND WATER INSOLUBLE, WATER SWELLABLE, BINDER RESIN

CROSS REFERENCE TO RELATED APPLICATIONS

This application is a continuation-in-part of U.S. patent application Ser. No. 07/431,257 filed Feb. 12, 1990 now abandoned which was a division of U.S. Patent application Ser. No. 183,841 filed Apr. 20, 1988, now U.S. Pat. No. 4,914,039 which is incorporated herein by reference.

BACKGROUND OF THE INVENTION

The present invention relates to an improved overlay or transfer type of negative working color proofing system which is developable with water alone. It has long been desired in the art to produce color proofing systems which are water developable. Water developability renders developer effluent more ecologically acceptable and provides a less hazardous working environment. Water developable color proofing systems are known in the art. These typically employ a combination of certain water soluble diazonium salts in conjunction with water soluble binder resins. While such materials are truly water developable, they are disadvantageous because fingerprint resistance is low. This invention improves upon such prior systems such as taught in U.S. Pat. No. 4,469,772 which specifies a combination of the methane sulfonate and mesitylene sulfonate salts and a water soluble resin binder. The present invention provides a combination of a water soluble diazonium salt and a water insoluble but water swellable resin binder.

In the field of reprographics, it is desirable to produce a color proof to assist a printer in correcting a set of photomasks which will be used in exposing printing plates. The proof should reproduce the color quality that will be obtained during the printing process. The proof must be a consistent duplicate of the desired half tone or line image, and should neither gain nor lose color. Visual examination of a color proof should reveal any defects on the photomask: the best color rendition to be expected from press printing of the material; the correct gradation of all colors and whether grays are neutral; and the need, if any, for subduing any of the colors and/or giving directions for altering the film photomask before making the printing plates.

Color proofing sheets for multicolored printing have heretofore been made by using a printing press proof which requires taking all the steps necessary for actual multicolor printing. Such a conventional method of color proofing has been costly and time consuming. Alternate color proofing methods have therefore been developed to simulate the quality of pressproofs. There are three known types of photographic color proofing methods, namely, the surprint type, the overlay type and the transfer type.

In the overlay type of color proofing, an independent transparent plastic support is used for producing an image of each color separation film. A number of such supports carrying colored images are then superimposed upon each other and placed on a white sheet to produce a color proof. Advantages are that it is quick and can serve as a progressive proof by combining any two or more colors in register.

In the surprint type of color proofing method, a color proofing sheet is prepared by successively producing images of different colors from different color separation films onto a single receptor sheet. This is done by utilizing a single opaque support and by applying toners, photosensitive solutions or coatings of photosensitive materials of corresponding colors on the opaque support in succession. An example of this approach is described in U.S. Pat. No. 3,671,236. An advantage of the surprint type of color proof is that the color saturation is not influenced by superimposed plastic supports. This method more closely resembles actual printing and eliminates the color distortion inherent in overlay systems.

Various processes for producing copies of an image embodying photopolymerization and thermal transfer techniques are know as shown in U.S. Pat. Nos. 3,060,023; 3,060,024; 3,060,025; 3,481,736; and 3,607,264. In these processes, a photopolymerizable layer coated on a suitable support is imagewise exposed to a photographic transparency. The surface of the exposed layer is then pressed into contact with the image receptive surface of a separate element and at least one of the elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material U.S. Pat. No, 3,574,049 provides a transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the design for the temporary support is lower than its affinity for the final support.

In U.S. Pat. No. 3,721,557, a method of transferring colored images is claimed which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor member and, subsequently, the carrier support sheet is stripped to accomplish the transfer of the image. A fresh layer of adhesive is applied to the receptor for each subsequent transfer.

This invention employs a water soluble diazonium salt which in the preferred embodiment is a polycondensation product of 3-methoxy-4-diazodiphenylamine sulfate and 4,4'-bis-methoxymethyl diphenylether precipitated as the chloride salt or the methane sulfonic acid salt, formulated with various water soluble and certain water insoluble but swellable resins to prepare a completely water developable overlay or, when overcoated with adhesive and transferred by lamination, a one piece proofing film. Additionally, since the preferred formulation utilizes water insoluble, water swellable resin binders, the films have the advantage of excellent fingerprint resistance.

SUMMARY OF THE INVENTION

Figure 1:
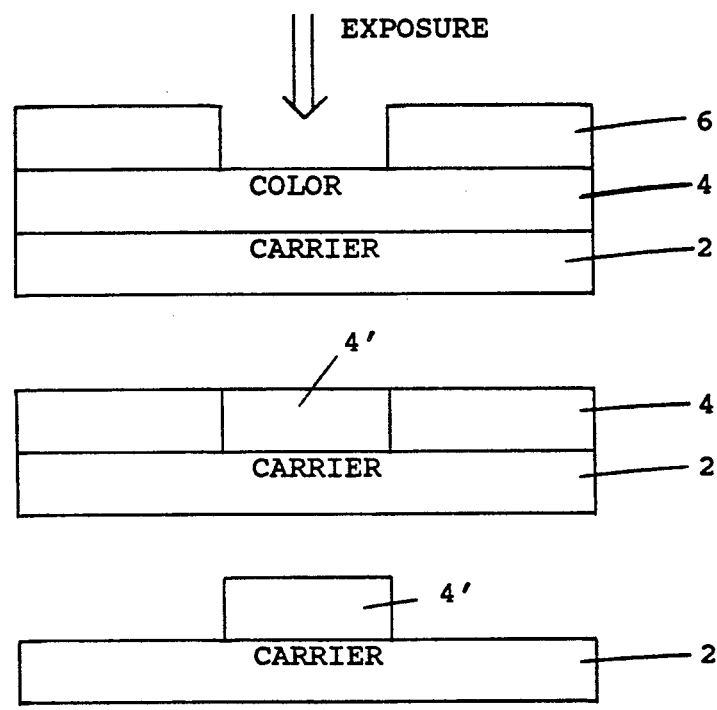
FIG. 1 shows a schematic view of the structure of an overlay color proofing system according to this invention.

The invention provides a color proofing film and method for forming a colored image which comprises:
A) providing a negative working, photosensitive, overlay color proofing film which comprises, in order:
  i) a transparent, preferably adhesion promoted substrate; and
  ii) a photosensitive layer on said substrate, which photosensitive layer comprises a light sensitive, water soluble, negative working, polymeric diazonium compound, which diazonium compound is present in sufficient amount to photosensitize said layer; and a water insoluble, water swellable binder resin in sufficient amount to bind the layer components in a uniform film; and at least one colorant in sufficient amount to uniformly color said layer; and then
B) imagewise exposing said photosensitive layer to sufficient actinic radiation to form a latent image; and then
C) developing said film with water.

In the most preferred embodiment the diazonium compound is the polycondensation product of 3-methoxy-4-diazodiphenylamine sulfate and 4,4'-bis-methoxymethyl diphenylether precipitated as the chloride salt or the methane sulfonic acid salt.

The invention also provides a color proofing film and a method for forming a colored image which comprises:
A) providing a negative working, photosensitive, transfer color proofing film which comprises, in order:
  i) a substrate having a release surface; and
  ii) a single, colored photosensitive layer on said release surface, which photosensitive layer comprises a light sensitive, water soluble, negative working, polymeric diazonium compound, which diazonium compound is present in sufficient amount to photosensitize said layer; and a water insoluble, water swellable binder resin in sufficient amount to bind the layer components in a uniform film; and at least one colorant in sufficient amount to uniformly color said layer; and
  iii) an adhesive layer on said photosensitive layer, which adhesive layer comprises a major amount of a polymeric material and which adhesive layer has a softening point in the range of from about 60° C. to about 180° C., and thereafter
B) either
  i) laminating said element with heat and pressure via said adhesive layer to a developer resistant receiver sheet; and removing said substrate by the application of peeling forces; and imagewise exposing said photosensitive layer to actinic radiation; or
  ii) imagewise exposing said photosensitive layer to actinic radiation; and laminating said element with heat and pressure via said adhesive layer to a developer resistant receiver sheet; and removing said substrate by the application of peeling forces; or
  iii) laminating said element with heat and pressure via said adhesive layer to a developer resistant receiver sheet; and imagewise exposing said photosensitive layer to actinic radiation; and removing said substrate by the application of peeling forces; and
C) removing the non-exposed areas of said photosensitive layer with water, which removing is conducted at a temperature at which said adhesive layer is substantially non-tacky, and preferably
D) repeating steps A through C at least once whereby another photosensitive element having at least one different colorant is laminated onto said receptor sheet over the non-removed portions of the previously laminated photosensitive layer or layers.

In the most preferred embodiment the diazonium compound is the polycondensation product of 3-methoxy-4-diazodiphenylamine sulfate and 4,4'-bis-methoxymethyl diphenylether precipitated as the chloride salt or the methane sulfonic acid salt.

Detailed Description of the Preferred Embodiment

In preparing the overlay version of this invention, one prepares a photographic element which broadly comprises a transparent substrate and a colored photosensitive layer on it.

In carrying out the transfer version of the invention, one employs a photographic element which broadly comprises a substrate having a release surface, a colored photosensitive layer on the release surface and an adhesive layer on the photosensitive layer. Optional additional layers containing anti-halation materials, adhesion promoters or release agents may also be used.

In the preferred embodiment, the substrate is composed of a dimensionally and chemically stable base material which does not significantly change its size, shape or chemical properties as the result of the heating, coating or other treatments which it must undergo. One preferred material is polyethylene terephthalate. In the usual case it has a thickness of from about 1 to about 10 mils, a more preferred thickness is from about 2–5 mils and most preferably from about 2–3 mils. Suitable films include Hostaphan 3000, available from Hoechst Celanese Corporation, Mylar D, available from DuPont and Melinex grades 0; 052; 442; 516 and S, available from ICI. The surface of the substrate may be smooth or may be provided with a matte texture by various methods known in the art.

Matte films include Melinex 377 and 470 from ICI. These materials have the unique property of giving the final image of the transfer version a desired matte finish without an extra steps. One can control the gloss of the final image by properly selecting the matte finish of the temporary support. This effect works because the top layer of the final image is originally in contact with this matte surface. This does not occur with a separate release layer between the temporary support and photosensitive layer. An additional advantage of coating on a matte surface is that subsequent transferred layers generally adhere better to a rough surface than to a smooth surface.

A similar matte finish of the final image can be obtained by embossing the shiny, top surface of the image with a matte material, such as described above. This is done by laminating together the final image and matte material under pressure and temperature. The matte material is then generally removed after lamination. The advantage of this method is that the finish of the final proof can be varied. Furthermore, the matting material can be used repeatedly.

A third method for producing a matte finish uses a heat transferable layer such as Butvar 90 available from Monsanto, coated onto a film with a rough surface such as Melinex 329, available from ICI. The adhesive layer is laminated to the final image under pressure and temperature. Then the film with the rough surface is peeled off. The rough surface imparts a matte finish to the final image. The advantage is that all layers appear matte and that the extra adhesive layer protects the image. U.S. Pat. Nos. 4,294,909 and 4,376,159 also suggest various methods for making a matte surface.

In the transfer case, the substrate must have a release surface, that is, it must be capable of releasably holding the photosensitive layer thereto. This may be accomplished either by the substrate surface being inherently releasable, being rendered releasable by a suitable treatment or being provided with a release layer over the substrate surface. Such a release layer may comprise polyvinyl alcohol.

Bonded to the substrate or the release surface is the photosensitive layer. The photosensitive layer broadly comprises a photosensitizer, a colorant, a binding resin, and other optional ingredients such as plasticizers, acid stabilizers, surfactants, anti-static compositions, uv absorbers and residual coating solvents.

The photosensitizer is a light sensitive, water soluble, polymeric diazonium compound. In the most preferred embodiment the diazonium compound is the polycondensation product of 3-methoxy-4-diazodiphenylamine sulfate and 4,4'-bis-methoxy methyl-diphenylether, precipitated as the chloride salt as taught in U.S. Pat. No. 3,849,392, which is incorporated herein by reference. Another preferred diazonium compound is the polycondensation product of 3-methoxy-4-diazo diphenylamine sulfate and 4,4'-bis-methoxymethyl diphenylether precipitated as the methane sulfonic acid salt.

Suitable binding resins are water insoluble and water swellable. Water insoluble resins include those which are less than about 2% by weight soluble in water. An important resin selection criterion is that it must be a good film former. The most preferred resins are polyvinyl acetate polymers such as Mowilith 30 which is available from Hoechst AG and has an average molecular weight of about 30,000; a polyvinyl alcohol/polyvinyl acetate copolymer available as Gelvatol 20/30 from Monsanto; a polyvinyl acetate/ crotonic acid (95:5) copolymer having an average molecular weight of about 100,000, available as Mowilith CT-5 from Hoechst AG. Carboset acrylic resins from B. F. Goodrich, Elvamide nylon multi-polymer resin from Dupont and Klucel, a partial propyl modified carboxymethyl cellulose available from Hercules are also useful.

The colorants useful for the present invention include various classes of dyes and pigments. In the most preferred embodiment, pigments having an average particle size of about 1 micrometer or less are used.

Optional plasticizers which may be incorporated into the photosensitive layer include those of the phthalate and phosphate types. Preferred plasticizers include dibutyl phthalate and dimethyl phthalate. Acid stabilizers include phosphoric acid and p-toluene sulfonic acid.

These ingredients may be blended with such compatible solvents as ethanol, methyl cellosolve and methyl ethyl ketone, coated on the release surface and dried. In the preferred embodiment, the photosensitive layer has a coating weight between approximately 0.1 and 5.0 g/m. The most preferred weight is from about 0.5 to 2.0 g/m.

In the preferred embodiment, the photosensitizer is present in the photosensitive layer in an amount of from about 10 to about 70 percent by weight; or more preferably from about 20 to about 60 percent by weight.

In the preferred embodiment, the colorant is present in the photosensitive layer in an amount of from about 5 to about 30 percent by weight; or more preferably from about 10 to about 20 percent by weight.

In the preferred embodiment, the binding resin is present in the photosensitive layer in an amount of from about 5 to about 50 percent by weight; or more preferably from about 15 to about 35 percent by weight.

In the preferred embodiment, the plasticizer, when one is used, is present in the photosensitive layer in an amount of up to about 10 percent by weight or more preferably at about 5 percent by weight.

In the preferred embodiment, the acid stabilizer, when one is used, is present in the photosensitive layer in an amount of up to about 10 percent of the photosensitizer.

In the transfer version the adhesive layer comprises a polymeric material which is preferably polyvinyl acetate and may optionally contain such other desired components as uv absorbers, anti-static compositions and plasticizers. Useful polyvinyl acetates non-exclusively include Mowilith DM-6, 20, DM-22, 25, 30 and mixtures thereof, available from Hoechst AG. Other suitable polymers non-exclusively include polyvinyl acetates, MOWILITH CT-5, as before described, polyvinyl acetals such as Formvar, available from Monsanto and the vinyl acetate/vinyl alcohol/vinyl acetal terpolymers described in U.S. Pat. No. 4,670,507 which is incorporated herein by reference. These are usually dispersed in water, or dissolved in methyl isobutyl ketone or n-butyl acetate or other solvent compositions for coating on the photosensitive layer. It is then dried to a coating weight of from about 5 to about 30 g/m$^2$, more preferably from about 10 to about 20 g/m$^2$. The layer may optionally contain a uv absorber such as Uvinul D-50 from GAF. It may also contain a plasticizer such as Resoflex R-296, available from Cambridge Industries. It may also contain antistats, such as Gafac and Gafstat from GAF. It may also contain other resins, such as Nitrocellulose RS ½, available from Hercules. The adhesive layer should not be tacky to the touch, during storage or during development of the photosensitive element. The layer should have a softening point in the range of from about 40° C. to about 180' C., preferably 60° C. to 120° C., more preferably 60° C. to 100° C. In the preferred embodiment, the polyvinyl acetate is present in the adhesive layer in an amount of greater than about 50 percent by weight. The plasticizer may be present in an amount of up to about 30 percent by weight, the uv absorber up to about 20 percent by weight, and other resins up to about 50 percent by weight.

Typical adhesive formulations include:

| I. | |
|---|---|
| Water | 50.00 |
| Mowilith DM-22 | 50.00 |
| II. | |
| n-butyl acetate | 78.00 |
| Resoflex R-296 | 1.00 |
| Mowilith 25 | 21.00 |
| III. | |
| n-butyl acetate | 68.70 |
| Uvinul D-50 | 1.30 |

| -continued | |
|---|---|
| Mowilith 20 | 30.00 |

In operation in the transfer mode, the photosensitive element is laminated to a receptor sheet via the adhesive layer. The receiver sheet should be resistant to any adverse effects which may be caused by the developer of choice. For example, the receiver sheet should be water resistant if aqueous developers are used. Plastic or plastic coated receiver sheets are useful for this purpose.

Useful receiver sheets include Melinex 329, 339, 99 and 3020 from ICI. Other white and non-white receiver sheets may also be used. Rough textured and/or adhesion promoted surfaces are preferred for the receiver, which must be able to withstand the laminating and development processes.

Lamination may be conducted by putting the receiver sheet in contact with the adhesive side of the colored composite and then introducing the two materials into the nip of a pair of heated laminating rollers under suitable pressure. Suitable laminating temperatures usually range from about 60° C. to about 90° C., preferably about 75° C. to about 85° C. After lamination, the substrate is peeled away, usually merely employing manual peeling forces. The adhesive and photosensitive layers thus remain on the receiver sheet.

The photosensitive layer is imagewise exposed by means well known in the art either before or after lamination. Such exposure may be conducted by exposure to a uv light source through a photomask under vacuum frame conditions. Exposure may be performed with actinic light through a conventional negative flat. Exposures after lamination and peel apart are preferred for emulsion-to-emulsion contact. Mercury vapor discharge lamps are preferred over metal halide lamps. Filters may be used to reduce light scattering in the material.

After lamination, peel apart and exposure, the photosensitive layer is developed by dissolving the non-exposed area in a water developer and dried. The adhesive layer is not removed by this development.

The process can then be repeated whereby another photosensitive element having a different color is laminated to the same receiver sheet over the previously formed image. In the usual case, four colored layers are employed to produce a full color reproduction of a desired image. These are cyan, magenta, yellow and black.

In the overlay version, the photosensitive layer on the substrate is exposed as above and developed with water. A colored image appears on the transparent substrate. In the usual case four such films, each bearing a different colored image, are produced. They are held over one another in register over an opaque background sheet. A full color image may thereby be examined. In the overlay version the substrate is preferably adhesion promoted by means well known in the art, such as that method taught in U.S. Pat. No. 4,157,918 which is incorporated herein by reference.

To further explain the operation of the overlay version of the invention, reference is now made to FIG. 1. A transparent substrate 2 is coated with photosesitive layer 4. This composite is exposed to actinic radiation through color separation negative 6. This produces exposed area 4' of layer 4. Upon development with water, the unexposed portion of layer 4 is removed and only imaqe portion 4' remains on substrate 2.

Figure 2:
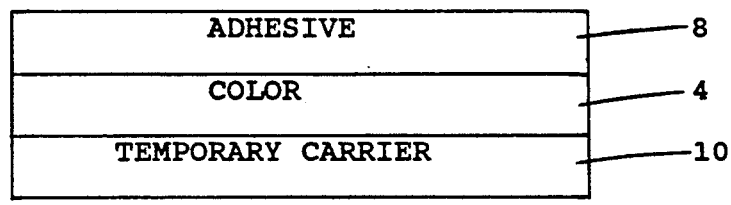
FIG. 2 shows a schematic view of the structure of a transfer type color proofing system according to this invention.
Figure 2:
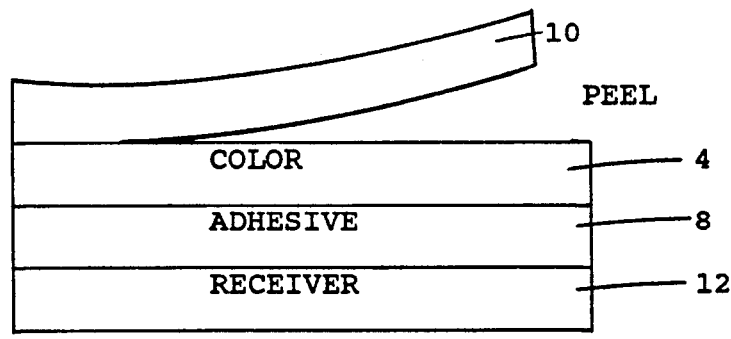
Figure 2:
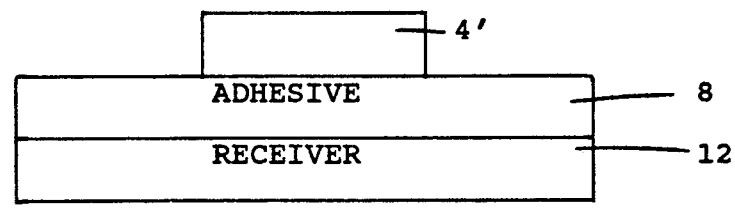

In the transfer mode, reference is made to FIG. 2 which explains one processing sequence. Temporary substrate 10 is coated with colored photosensitive layer 4 and adhesive layer 8. This construction is then laminated to a receiver sheet 12 via the adhesive 8 and the temporary substrate 10 is peeled away. After exposure and development of the photosensitive layer with water, exposed image 4' is positioned on the adhesive/substrate composite.

The following non-limiting examples serve to illustrate the invention:

EXAMPLE 1

30 grams of Elvamide (nylon multi-polymer resin from Dupont) are dissolved in 640 g of ethanol and 160 g of water with slight heating. This is mixed with 1.1 g of the polycondensation product of 3-methoxy-4-diazodiphenylamine sulfate and 4,4'-bis-methoxymethyl diphenylether precipitated as the chloride salt dissolved in 20 g methanol and 20 g of water. Then 0.45 g. Calcozine Yellow dye is added. The solution is coated onto Mlinex 505 adhesion promoted polyester film (available commercially from ICI) at 750 mg/m$^2$ coating weight. Sample is then dried at 100° C. for 1 min. The sample is exposed with metal halide light source for 10 seconds through a negative test flat and developed with tap water giving a usable lithographic image on the sheet.

EXAMPLE 2

Example 1 is repeated except the water soluble diazonium salt used is the polycondensation product of 3-methoxy-4-diazo diphenylamine sulfate and 4,4'-bis-methoxymethyl diphenylether precipitated as the methane sulfonic acid salt. The exposed material can be developed by spraying with tap water.

EXAMPLE 3

Example 1 is repeated except Klucel (partial propyl modified carboxymethyl cellulose) is used as the water insoluble but swellable resin and Victoria Pure Blue dye is used as the colorant. The imaged film can be developed by a tap water spray.

EXAMPLE 4

Example 3 is repeated except the polycondensation product of 3-methoxy-4-diazo diphenylamine sulfate and 4,4'-bis-methoxymethyl diphenylether precipitated as the methane sulfonic acid salt is used. The imaged film can be developed by wiping with a cotton Webril wipe and water alone as the developer.

EXAMPLE 5 (OVERLAY)

A resin binder stock solution is prepared by dissolving 30 g of Gelvatol 20/30 (Polyvinyl alcohol/polyvinyl acetate copolymer) in 800 ml. of H$_2$O and adding 200 ml. of ethanol and 0.2 ml. Triton X-100. To 20 g. of this stock solution, 20 g. of methanol, 0.45 g Calcozine yellow and 1.1 g. of the polycondensation product of 3-methoxy-4-diazo diphenylamine sulfate and 4,4'-bis-methoxymethyl diphenylether precipitated as the chloride salt, are added and stirred until dissolved.

An aliquot is coated by Meir rod drawdown onto a Melinex 516 polyester sheet. After oven drying at 100° C. for one minute, the coated sheet is exposed in a Berkey-Ascor exposure light source through a negative mask. The sample could be spray developed with water giving excellent resolution including 6 micron lines of an UGRA target.

EXAMPLE 6 (TRANSFER)

To 25 g. of methyl Cellosolve and 25 g. of methanol are added 0.3 g. Mowilith CT-5 resin (polyvinyl acetate/crotonic acid: 95/5) followed by Victoria Cyan at 0.023 g. and Victoria Pure Blue at 0.35 g. After dissolving these dyes, 1.0 g. of the diazo of example 5 are dissolved and the solution is coated onto Melinex 516 with a Meir rod. After oven drying for one minute at 100° C., the color coat is overcoated with Mowilith 30 (polyvinylacetate) to a coating weight of 10–12 g/m². After drying at 100° C. for one minute, the coatings (color coat and adhesive) can be transferred by lamination at 165° F. to an adhesion promoted (acrylate) white receiver sheet (Melinex 3020). Exposure in a Berkey Ascor light source through a negative mask followed by water development gives excellent image contrast with good fingerprint resistance.

EXAMPLE 7

The coating solution of Example 5 is diluted 1:1 with a 50:50 mixture of methyl Cellosolve and methanol. An aliquot is coated with a Meir rod onto a polyester sheet. After air drying at 100° C. for one minute, the coated sheet is exposed in a Berkey-Ascor exposure light source. The sample could be spray developed with water, giving excellent resolution including 8 microns of a UCRA test target.

EXAMPLE 8

The composition of Example 7 is 1:1 diluted with a 50:50 mixture of methyl Cellosolve and methanol and the steps are repeated. The sample is still imageable with a resolution of at least 12 microns with a UCRA test target.

What is claimed is:

1. A method for forming an overlay color proofing image on a transparent substrate which comprises
   A) providing a negative working, photosensitive, overlay color proofing film which consists essentially of, in order:
      i) a smooth transparent substrate; and
      ii) a photosensitive layer on said substrate, which photosensitive layer comprises a light sensitive, water soluble, negative working, polymeric diazonium compound, which diazonium compound is present in sufficient amount to photosensitize said layer; and a water insoluble, water swellable binder resin in sufficient amount to bind the layer components in a uniform film; and at least one colorant in sufficient amount to uniformly color said layer; and then
   B) imagewise exposing said photosesitive layer to sufficient actinic radiation to form a latent image; and then
   C) developing the latent image carrying photosensitive layer on said film with water alone to thereby remove the non-exposed areas of the photosensitive layer.

2. The method of claim 1 wherein the diazonium compound is the polycondensation product of 3-methoxy-4diazodiphenylamine sulfate and 4,4'-bis-methoxymethyl diphenylether precipitated as the chloride salt or the methane sulfonic acid salt.

3. The method of claim 1 wherein said substrate comprises polyethylene terephthalate.

4. The method of claim 1 wherein said photosensitive layer further comprises one or more ingredients selected from the group consisting of plasticizers, acid stabilizers, antistatic compositions, uv absorbers and surfactants.

5. The method of claim 1 wherein the diazonium compound is present in the photosensitive layer in an amount of from about 10 to about 70 percent by weight of the layer.

6. The method of claim 1 wherein the colorant is present in TM the photosensitive layer in an amount of from about 5 to about 30 percent by weight.

7. The method of claim 1 wherein the binder resin is present in the photosensitive layer in an amount of from about 5 to about 50.0 percent by weight.

8. The method of claim 1 wherein the binder resin comprises one or more polymers selected from the group consisting of a polyvinyl alcohol/polyvinyl acetate copolymer, a polyvinyl acetate/crotonic acid copolymer, polyvinyl acetate homopolymers, 9. The method of claim 1 further comprising the subsequent step of repeating steps A, B and C at least once, thus forming at least one additional overlay color proofing image on another transparent substrate, said additional color proofing image comprising a different colorant; and superimposing said overlay color proofing images and their respective substrates.

* * * * *